(12) United States Patent
Chen et al.

(10) Patent No.: US 11,955,567 B2
(45) Date of Patent: Apr. 9, 2024

(54) WIDE-BAND GAP SEMICONDUCTOR DEVICE AND METHOD OF MANUFACTURING THE SAME

(71) Applicant: LEAP Semiconductor Corp., Taoyuan (TW)

(72) Inventors: Wei-Fan Chen, Taichung (TW); Kuo-Chi Tsai, Taoyuan (TW)

(73) Assignee: LEAP Semiconductor Corp., Taoyuan (TW)

( * ) Notice: Subject to any disclaimer, the term of this patent is extended or adjusted under 35 U.S.C. 154(b) by 47 days.

(21) Appl. No.: 17/672,715

(22) Filed: Feb. 16, 2022

(65) Prior Publication Data

US 2023/0261119 A1 Aug. 17, 2023

(51) Int. Cl.
*H01L 29/872* (2006.01)
*H01L 29/06* (2006.01)
*H01L 29/868* (2006.01)

(52) U.S. Cl.
CPC ........ *H01L 29/872* (2013.01); *H01L 29/0619* (2013.01); *H01L 29/868* (2013.01)

(58) Field of Classification Search
CPC . H01L 29/872; H01L 29/0619; H01L 29/868; H01L 29/0661; H01L 29/66143; H01L 29/0692; H01L 29/6606; H01L 29/1608; H01L 29/66136
See application file for complete search history.

(56) References Cited

U.S. PATENT DOCUMENTS

| | | | |
|---|---|---|---|
| 5,914,500 | A | 6/1999 | Bakowski et al. |
| 7,026,668 | B2 | 4/2006 | Hatakeyama et al. |
| 8,232,558 | B2 | 7/2012 | Zhang et al. |
| 8,563,988 | B2 | 10/2013 | Uchida et al. |
| 8,890,169 | B2 | 11/2014 | Kameshiro et al. |
| 10,164,126 | B2 | 12/2018 | Mihaila et al. |
| 10,229,988 | B2 | 3/2019 | Tipirneni et al. |

(Continued)

FOREIGN PATENT DOCUMENTS

TW 201631666 9/2016

OTHER PUBLICATIONS

"Office Action of Taiwan Counterpart Application", dated Oct. 26, 2022, p. 1-p. 3.

(Continued)

*Primary Examiner* — Shahed Ahmed
*Assistant Examiner* — Khatib A Rahman
(74) *Attorney, Agent, or Firm* — JCIPRNET

(57) ABSTRACT

A wide-band gap semiconductor device and a method of manufacturing the same are provided. The wide-band gap semiconductor device of the disclosure includes a substrate, an epitaxial layer, an array of merged PN junction Schottky (MPS) diode, and an edge termination area surrounding the array of MPS diode. The epitaxial layer includes a first plane, a second plane, and trenches between the first plane and the second plane. The array of MPS diode is formed in the first plane of the epitaxial layer. The edge termination area includes a floating ring region having floating rings formed in the second plane of the epitaxial layer, and a transition region between the floating ring region and the array of MPS diode. The transition region includes a PIN diode formed in the plurality of trenches and on the epitaxial layer between the trenches.

11 Claims, 12 Drawing Sheets

(56) References Cited

U.S. PATENT DOCUMENTS

| | | |
|---|---|---|
| 10,497,816 B2 | 12/2019 | Aketa et al. |
| 2014/0264477 A1 | 9/2014 | Bhalla |
| 2018/0166530 A1* | 6/2018 | Lichtenwalner ...... H01L 29/063 |
| 2021/0391437 A1* | 12/2021 | Ohse .................. H01L 21/0485 |

OTHER PUBLICATIONS

Carl-Mikael Zetterling et al., "High Voltage Silicon Carbide Junction Barrier Schottky Rectifier", 1997 Proceedings IEEE/Cornell Conference on Advanced Concepts in High Speed Semiconductor Devices and Circuits, Aug. 4-6, 1997, pp. 256-262.

Clive Poole et al., "Chapter 11. Microwave semiconductor materials and diodes", Microwave Active Circuit Analysis and Design, 2015 Elsevier Ltd., pp. 355-393.

M. Treu et al., "A Surge Current Stable and Avalanche Rugged SiC Merged pn Schottky Diode Blocking 600V Especially Suited for PFC Applications", Materials Science Forum vols. 527-529, Oct. 2006, pp. 1155-1158.

V. Banu et al., "Behaviour of 1.2 kV SiC JBS diodes under repetitive high power stress", Microelectronics Reliability, Aug. 2008, pp. 1444-1448.

* cited by examiner

WIDE-BAND GAP SEMICONDUCTOR DEVICE AND METHOD OF MANUFACTURING THE SAME

BACKGROUND

Technical Field

The disclosure relates to a semiconductor device, and particularly relates to a wide-band gap semiconductor device and a method of manufacturing the same.

Description of Related Art

A semiconductor rectifying device includes a PiN diode having a pn junction and a Schottky barrier diode (SBD) having a carrier potential barrier of a difference in work function between a semiconductor layer and metal, and it can rectify input current to output the rectified current. In the SBD, a JBS (Junction Barrier Schottky) diode is disposed in a surface of the semiconductor layer in order to relax an electric field applied to an interface between the semiconductor layer and the metal. The JBS includes a doping region (for example, p type) having a conductive type different from that of the semiconductor layer (for example, n type). There is also a merged PN junction Schottky (MPS) diode, in which the contact between the p type region and the metal of the JBS is set to or brought close to ohmic connection, and a minority carrier is injected to decrease a resistance by conductivity modulation when a voltage exceeding a built-in potential (Vbi) between the doping region and the semiconductor layer is applied.

On the other hand, a wide band-gap semiconductor such as silicon carbide (SiC) is expected as a next-generation power semiconductor device. The wide band-gap semiconductor has a wide bandgap, high breakdown field strength, and high thermal conductivity compared with Si. A low-loss power semiconductor device that can be operated at high temperature can be implemented using the characteristics of the wide band-gap semiconductor.

Recently, SiC Schottky diodes are mainly used in the power factor control (PFC) unit of high end switch mode power supply (SMPS) due to their outstanding switching performance compared to Si pn diodes. On the other hand, they are offering only comparatively low tolerance concerning surge current stress as it regularly occurs during power on or after line cycle drop outs. This is due to the unipolar nature of the Schottky device with a significant positive temperature coefficient of the resistivity. Hence, an improvement of this surge current capability is urgently required.

SUMMARY

The disclosure provides a wide-band gap semiconductor device with improved surge current capability resulting in the increase the performance/cost ratio of the device.

The disclosure further provides a method of manufacturing a wide-band gap semiconductor device.

The wide-band gap semiconductor device of the disclosure includes a substrate, an epitaxial layer, an array of merged PN junction Schottky (MPS) diode, and an edge termination area surrounding the array of MPS diode. The epitaxial layer includes a first plane, a second plane around the first plane, a plurality of trenches between the first plane and the second plane, and the second plane is closer to the substrate than the first plane. The array of MPS diode is formed in the first plane of the epitaxial layer. The edge termination area includes a floating ring region having floating rings formed in the second plane of the epitaxial layer, and a transition region between the floating ring region and the array of MPS diode. The transition region comprises a PIN diode formed in the plurality of trenches and on the epitaxial layer between the trenches.

In an embodiment of the disclosure, the array of MPS diode comprises a plurality of first p+ doping regions and a Schottky metal layer, the first p+ doping regions are in the epitaxial layer to form a PN junction between the epitaxial layer and each of the first p+ doping regions, and the Schottky metal layer is disposed on the epitaxial layer to form a plurality of Schottky diodes with the epitaxial layer among the first p+ doping regions.

In an embodiment of the disclosure, the Schottky diodes are enclosed by the first p+ doping regions.

In an embodiment of the disclosure, a shape of the Schottky diodes is bar-shapes, dot-shape, hexagonal shape, circular shape, or a combination thereof.

In an embodiment of the disclosure, the first p+ doping regions are enclosed by the Schottky diodes.

In an embodiment of the disclosure, a depth of the first p+ doping regions is ranged between 0.1 μm and 0.35 μm.

In an embodiment of the disclosure, the Schottky metal layer extends to cover sidewalls and bottoms of the trenches and on the epitaxial layer between the trenches.

In an embodiment of the disclosure, the PIN diode includes a second p+ doping region formed in the sidewalls and the bottoms of the trenches and on the epitaxial layer between the trenches.

In an embodiment of the disclosure, a depth of each of the trenches is ranged between 0.3 μm and 2 μm.

In an embodiment of the disclosure, a bottom of each of the trenches is the same plane as the second plane.

In an embodiment of the disclosure, a number of the floating rings is between 5 and 50.

In an embodiment of the disclosure, the plurality of floating rings is a plurality of third p+ doping regions.

The method of manufacturing the wide-band gap semiconductor device of the disclosure includes forming an epitaxial layer on a substrate, wherein the epitaxial layer includes a first plane, removing a portion of the epitaxial layer to form a second plane around the first plane and trenches between the first plane and the second plane, forming an array of merged PN junction Schottky (MPS) diode in the first plane of the epitaxial layer, forming a PIN diode in the trenches and on the epitaxial layer between the trenches, and forming a plurality of floating rings in the second plane of the epitaxial layer. The array of MPS diode includes a plurality of first p+ doping regions in the epitaxial layer to form a PN junction between the epitaxial layer and each of the first p+ doping regions, and a plurality of Schottky diodes with the epitaxial layer among the first p+ doping regions. The PIN diode includes a second p+ doping region. The plurality of floating rings is a plurality of third p+ doping regions, and the first p+ doping regions, the second p+ doping region, and the third p+ doping regions are implanted simultaneously.

In another embodiment of the disclosure, the step of forming the array of MPS diode includes forming a Schottky metal layer to form the plurality of Schottky diodes with the epitaxial layer among the first p+ doping regions.

In another embodiment of the disclosure, the step of forming the Schottky metal layer includes extending the Schottky metal layer to cover sidewalls and bottoms of the trenches and on the epitaxial layer between the trenches.

In another embodiment of the disclosure, the step for forming the first p+ doping regions, the second p+ doping region and the third p+ doping regions is one-step implantation or two-step implantation.

Based on the above, according to the wide-band gap semiconductor device of the disclosure, the PIN diode is formed in the trenches between the array of MPS diode and the floating rings. Since the contact area of the PIN diode is significantly increased, the forward bias current densities can be greatly enhanced with the aid of trench side-wall metallurgy junction; therefore, the robustness of surge are therefore great enhanced. Moreover, the array of MPS diode and the floating rings within the edge termination area are disposed at different planes. Since the floating rings are located at the plane closer to the substrate than the array of MPS diode, the MPS diode and the PIN diode in the transition region are electrical shielded by the floating rings due to early breakdown characteristic of closing to the substrate. The MPS diodes of the disclosure, thereby, have better repetitive avalanche ruggedness performance. In addition, according to the method of the disclosure, the doping regions of the floating rings in the floating ring region, the PN junction of the MPS diodes, and the PIN diode in the transition region can be formed simultaneously, and thus the cost and time for manufacturing the wide-band gap semiconductor device can be saved efficiently.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
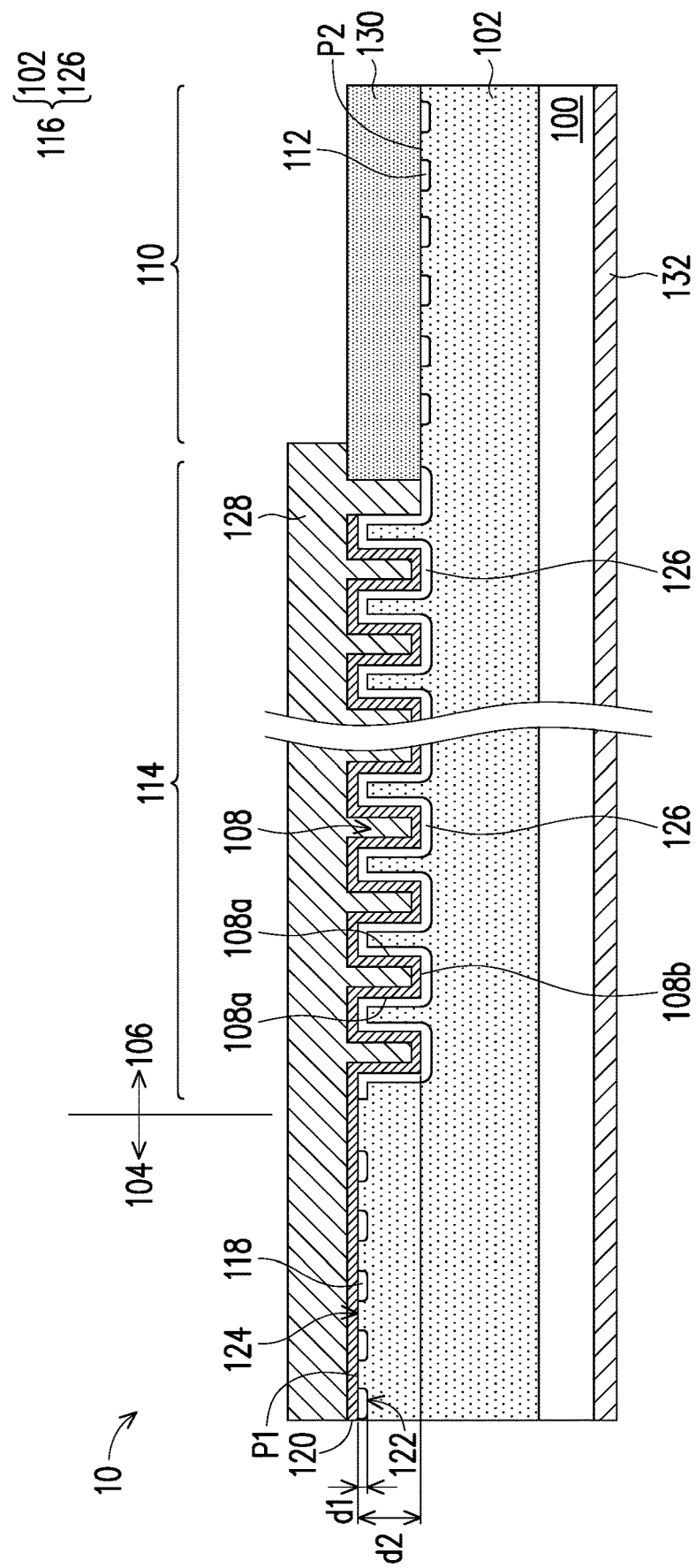
FIG. 1 is a cross-sectional view of a wide-band gap semiconductor device according to an embodiment of the disclosure.

With reference to the drawings attached, the disclosure will be described by means of the embodiments below. Nevertheless, the disclosure may be embodied in many different forms and should not be construed as limited to the embodiments set forth herein. In the drawings, for the purpose of clarity and specificity, the sizes and the relative sizes of each layer and region may not be illustrated in accurate proportion.

FIG. 1 is a cross-sectional view of a wide-band gap semiconductor device according to an embodiment of the disclosure.

Referring to FIG. 1, the wide-band gap semiconductor device 10 of the embodiment includes at least a substrate 100, an epitaxial layer 102, an array of merged PN junction Schottky (MPS) diode 104, and an edge termination area 106 surrounding the array of MPS diode 104. The epitaxial layer 102 includes a first plane P1, a second plane P2 around the first plane P1, a plurality of trenches 108 between the first plane P1 and the second plane P2, and the second plane P2 is closer to the substrate 100 than the first plane P1. The array of MPS diode 104 is formed in the first plane P1 of the epitaxial layer 102. The edge termination area 106 includes a floating ring region 110 having floating rings 112 formed in the second plane P2 of the epitaxial layer 102, and a transition region 114 between the floating ring region 110 and the array of MPS diode 104. In one embodiment, a number of the floating rings 112 is, for instance, between 5 and 50. The transition region 114 comprises a PIN diode 116 formed in the plurality of trenches 108 and on the epitaxial layer 102 between the trenches 108. In one embodiment, the substrate 100 is N+ substrate, and the epitaxial layer 102 is N− epitaxial layer. The substrate 100 may be a high doping wideband semiconductor substrate such as a silicon carbide (SiC) substrate. However, the disclosure is not limited herein; in another embodiment, the substrate 100 is a silicon substrate.

Referring to FIG. 1 again, the array of MPS diode 104 includes a plurality of first p+ doping regions 118 and a Schottky metal layer 120, the first p+ doping regions 118 are in the epitaxial layer 120 to form a PN junction 122 between the epitaxial layer 120 and each of the first p+ doping regions 118, and the Schottky metal layer 120 is disposed on the epitaxial layer 102 to form a plurality of Schottky diodes 124 with the epitaxial layer 102 among the first p+ doping regions 118. A depth d1 of the first p+ doping regions 118 is, for instance, ranged between 0.1 μm and 0.35 μm. The material of the Schottky metal layer 120 comprises a refractory metal silicide or a refractory metal, wherein the refractory metal is, for instance, Ti, Ni, W, or Mo; the refractory metal silicide is, for instance, titanium silicide, nickel silicide, tungsten silicide, or molybdenum silicide.

As shown in FIG. 1, the PIN diode 116 includes a second p+ doping region 126. In one embodiment, the N-type impurity concentration of the epitaxial layer 102 is ranged between 1E15 to 5E16 $cm^{-3}$, and the second p+ doping region 126 includes two layers in which the upper layer has a P-type impurity concentration ranged between 1E18 to 2E19 $cm^{-3}$, and the lower layer has a P-type impurity concentration ranged between 5E16 to 7E17 $cm^{-3}$. Accordingly, the upper layer of the second p+ doping region 126, the lower layer of the second p+ doping region 126, and the epitaxial layer 102 (as a drift layer) compose the PIN diode 116. The second p+ doping region 126 is formed in the sidewalls 108a and the bottoms 108b of the trenches 108 and also formed on the epitaxial layer 102 between the trenches 108, and thus the contact area of the PIN diode 116 is significantly larger than that formed on plat plane. The Schottky metal layer 120 is further extended to cover the sidewalls 108a and the bottoms 108b of the trenches 108, and a top metal layer 128 is formed on the Schottky metal layer 120 and extends to fill each of the trenches 108 in the transition region. A material of the top metal layer 128 is, for instance, aluminum, copper or gold. Since the forward bias junction current is proportion to the metallurgy area, the forward bias current can be greatly enhanced with the aid of trench side-wall metallurgy junction. In particular, the metallurgy junction area includes bottom metallurgy junction area, top metallurgy junction, and additional sidewall metallurgy junction area, wherein the bottom metallurgy junction area is located at the bottoms 108b, the top metallurgy junction is located at the surface of the epitaxial layer 102 between the trenches 108, and the additional sidewall metallurgy junction area is located at the sidewalls 108a. Therefore, the robustness of surge is therefore great enhanced. In one embodiment, a depth d2 of each of the trenches 108 is, for instance, ranged between 0.3 µm and 2 µm. In one embodiment, the bottom 108b of each of the trenches 108 may be the same plane as the second plane P2, and thus the step of etching the trenches 108 can be the same as that of forming the second plane P2.

In addition, the plurality of floating rings 112 may be a plurality of third p+ doping regions, and thus, in view of simplifying manufacturing steps, the first p+ doping regions 118, the second p+ doping region 126, and the third p+ doping regions (i.e. floating rings 112) can be implanted simultaneously. However, the disclosure is not limited herein. An insulating layer 130 may be formed on the surface of the floating rings 112, and an edge of the top metal layer 128 may be disposed on the insulating layer 130 at the interface of the floating ring region 110 and the transition region 114. In the wide-band gap semiconductor device 10, a cathode metal layer 132 is formed on the back surface of the substrate 100.

Figure 2A:
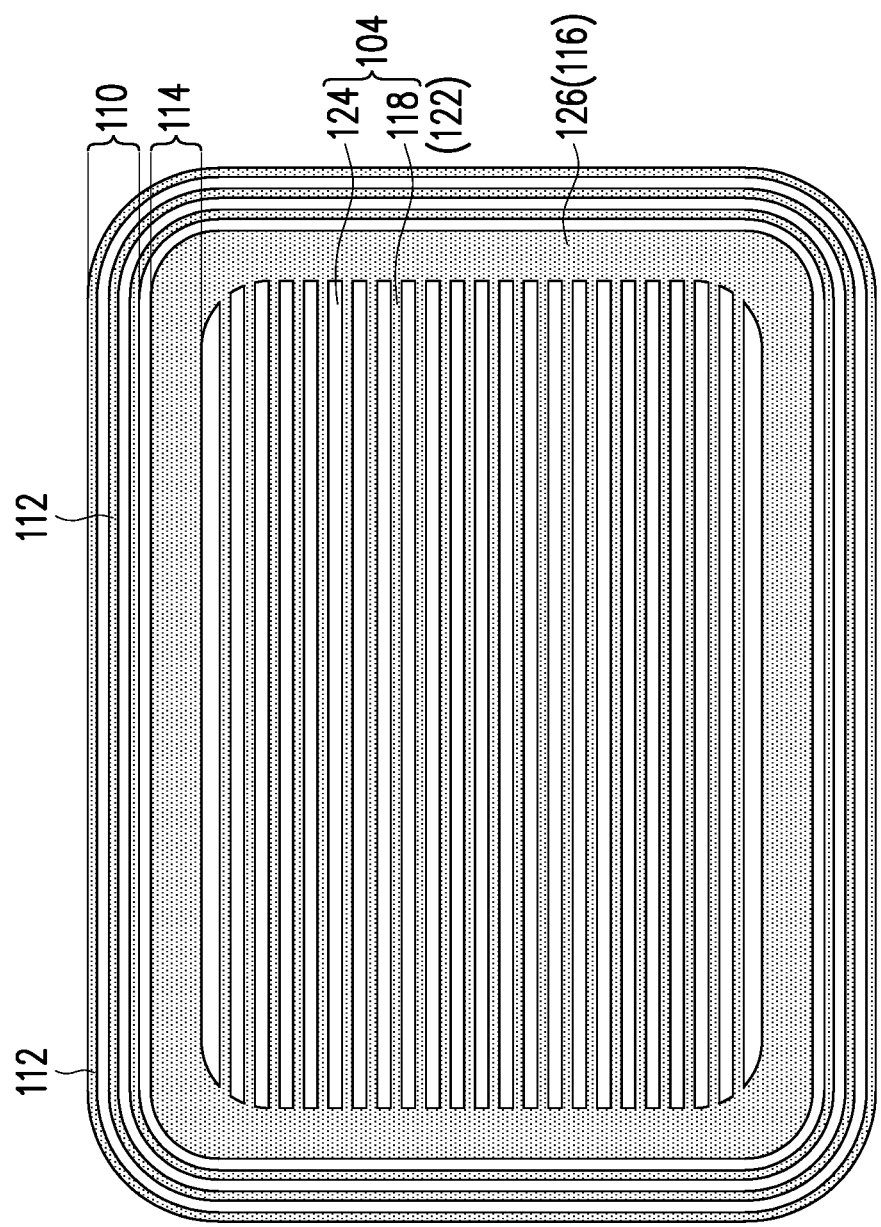
FIG. 2A is a plan view of a first example of the wide-band gap semiconductor device according to the embodiment of the disclosure.

FIG. 2A is a plan view of a first example of the wide-band gap semiconductor device according to above embodiment of the disclosure. Please note that, in order to clarify the drawings, there is only shown the p+ doping regions (e.g. the first p+ doping regions 118, the second p+ doping region 126, and the floating rings 112) in all of the plan views, and the numbers of the first p+ doping regions 118 and the floating rings 112 are not the same as those in FIG. 1.

Referring to FIG. 2A, the array of MPS diode 104 is surrounded by the PIN diode 116 in the transition region 114, and the floating rings 112 in the floating ring region 110 are disposed at outside of the transition region 114, wherein the PN junctions 122 and the Schottky diodes 124 are alternatively arranged along a horizontal line. In other words, FIG. 1 is a cross-sectional view along a half of the vertical line of FIG. 2A.

Figure 2B:
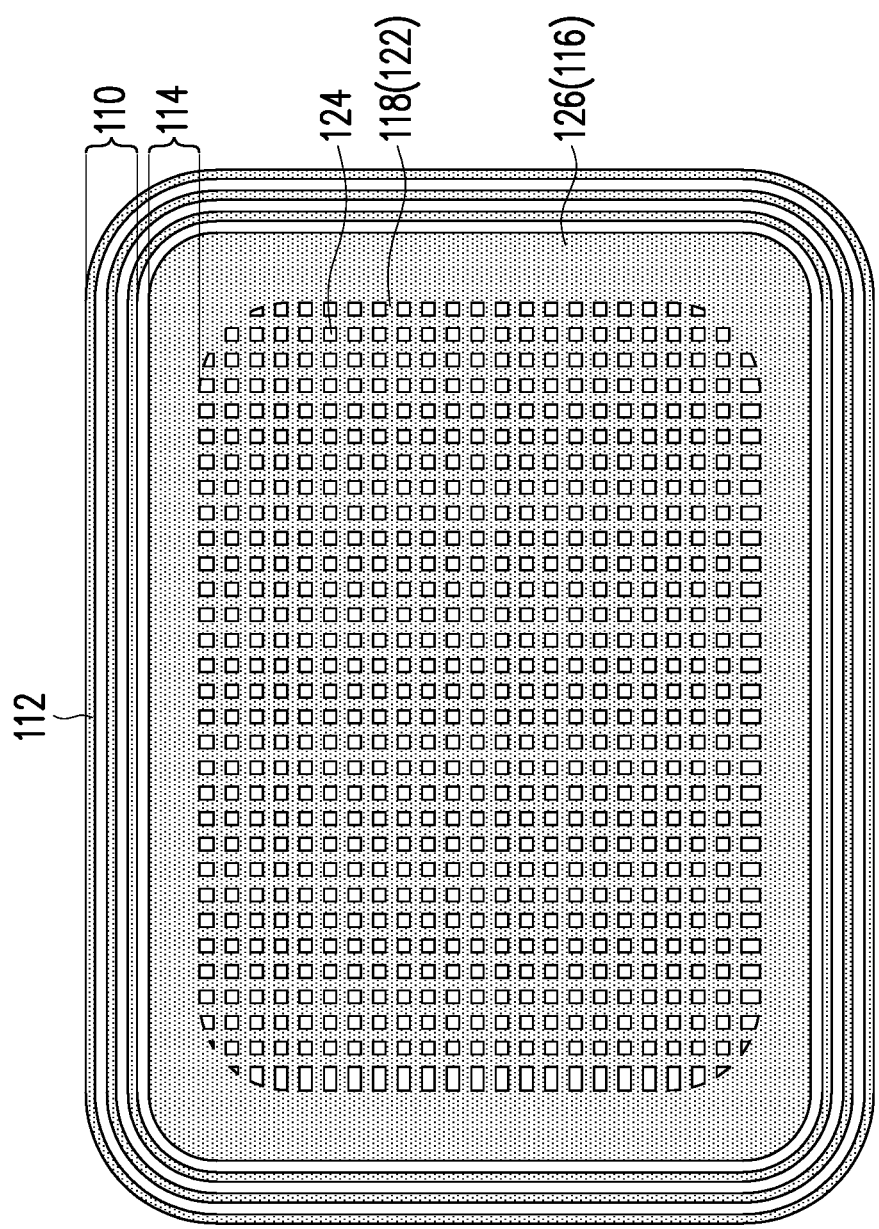
FIG. 2B is a plan view of a second example of the wide-band gap semiconductor device according to the embodiment of the disclosure.

FIG. 2B is a plan view of a second example of the wide-band gap semiconductor device according to above embodiment of the disclosure.

Referring to FIG. 2B, in view of reducing current leakage, the Schottky diodes 124 are enclosed by the first p+ doping regions 118. That is, the Schottky diodes 124 are enclosed by the PN junction 122. In FIG. 2B, the shape of the Schottky diodes 124 is dot-shape, but it is not limited herein. The shape of the Schottky diodes 124 may be bar-shape, hexagonal shape, circular shape, dot-shape, or a combination thereof.

Figure 2C:
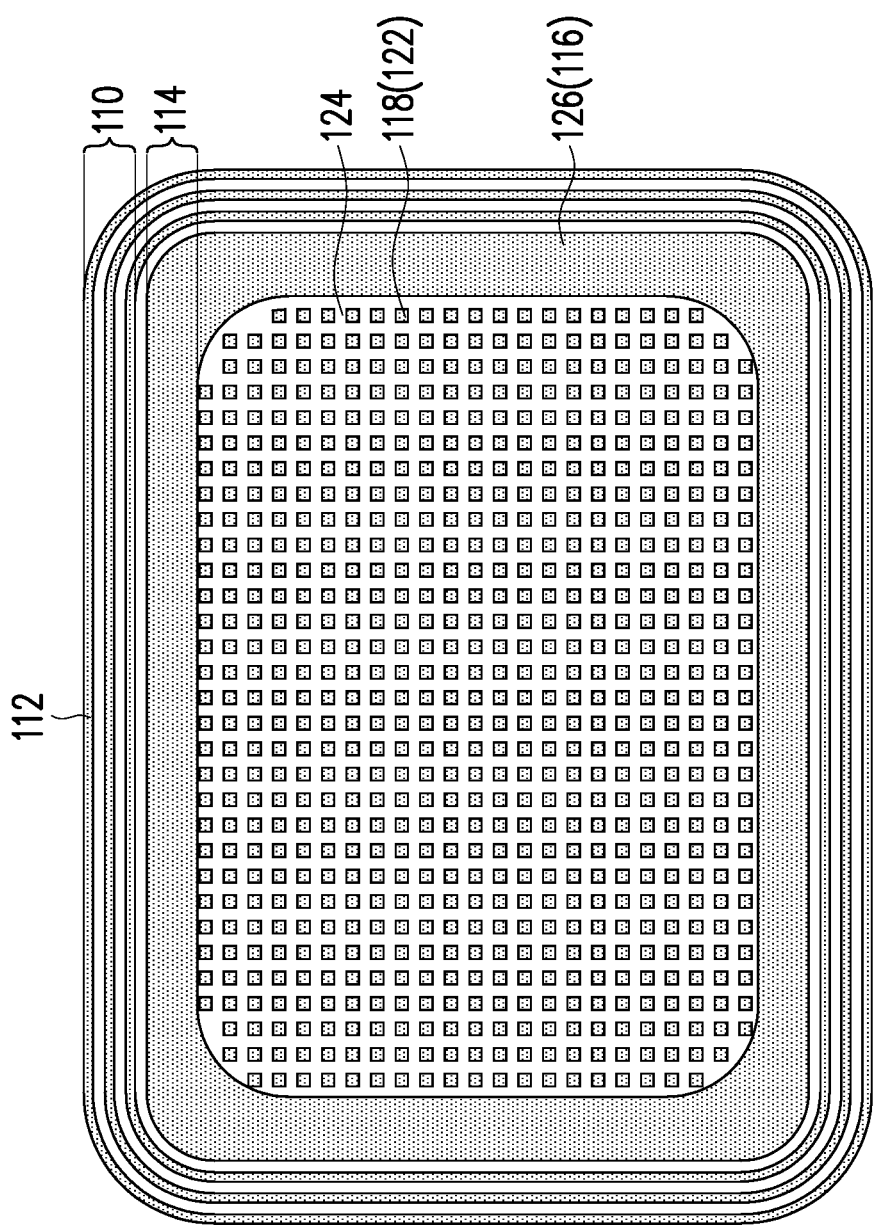
FIG. 2C is a plan view of a third example of the wide-band gap semiconductor device according to the embodiment of the disclosure.

FIG. 2C is a plan view of a third example of the wide-band gap semiconductor device according to above embodiment of the disclosure.

Referring to FIG. 2C, the first p+ doping regions 118 are enclosed by the Schottky diodes 124. That is, the PN junctions 122 are enclosed by the Schottky diodes 124.

FIGS. 3A to 3H are cross-sectional views illustrating steps of a method of manufacturing a wide-band gap semiconductor device according to another embodiment of the disclosure, wherein the reference symbols used in above embodiment are used to equally represent the same or similar components. The description of the same components can be derived from above embodiment, and will not be repeated herein.

Figure 3A:
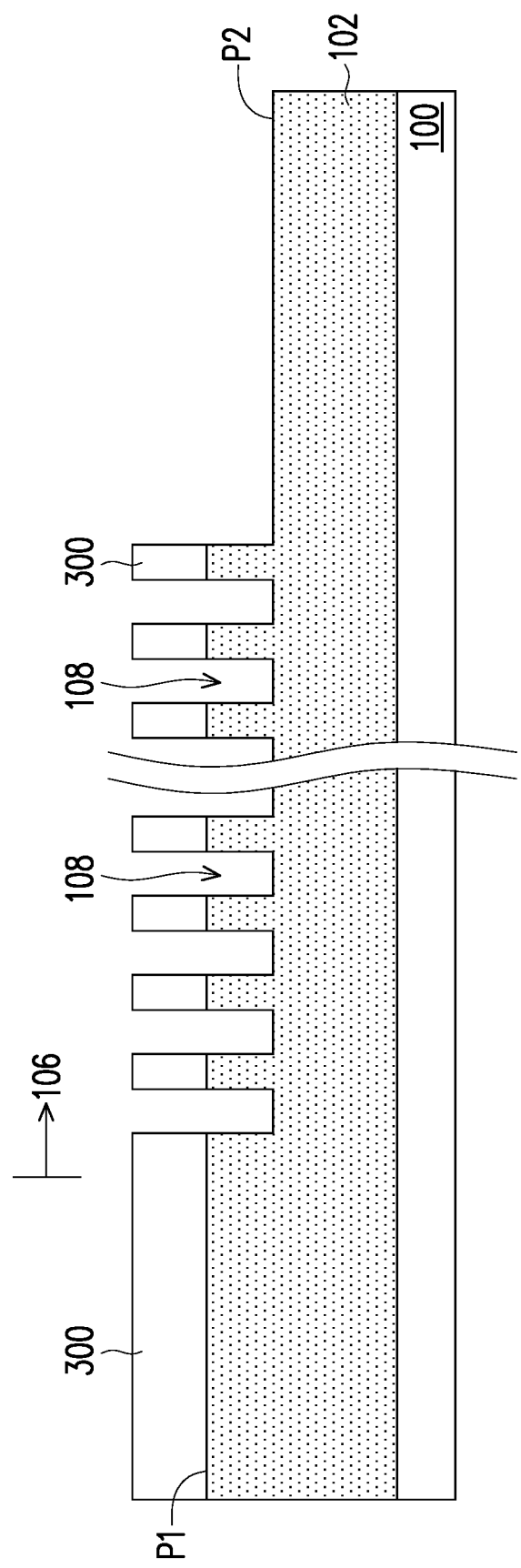
FIGS. 3A to 3H are cross-sectional views illustrating steps of a method of manufacturing a wide-band gap semiconductor device according to another embodiment of the disclosure.

Referring to FIG. 3A, an epitaxial layer 102 is formed on a substrate 100. The epitaxial layer 102 has a first plane P1, and an etching block layer 300 is formed on the epitaxial layer 102 to expose a portion of the epitaxial layer 102 in the edge termination area 106. By using the etching block layer 300 as an etching mask, an anisotropic etching is, for instance, performed to remove a portion of the epitaxial layer 102 and form a second plane P2 around the first plane P1 and form trenches 108 between the first plane P1 and the second plane P2. In one embodiment, the substrate 100 is N+ substrate, and the epitaxial layer 102 is N- epitaxial layer.

Figure 3B:
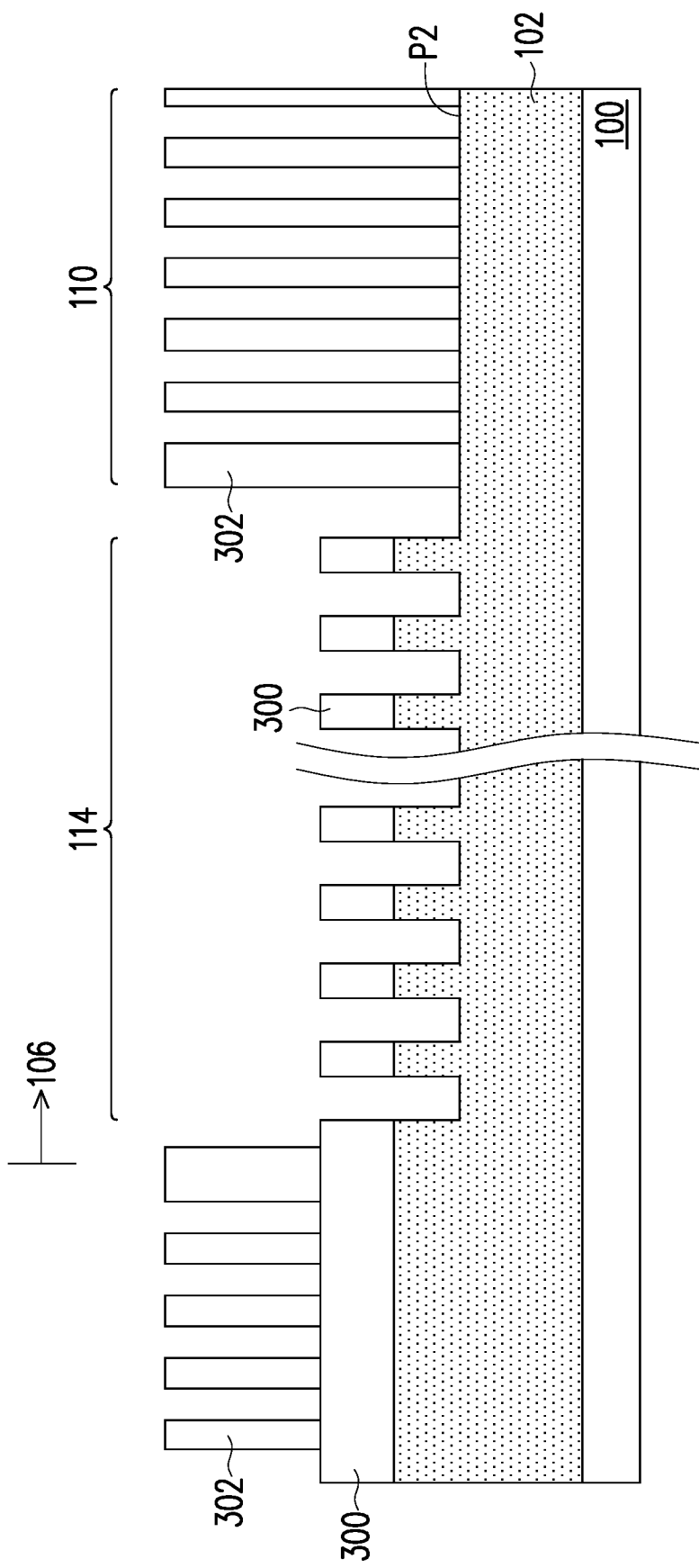

Then, referring to FIG. 3B, in order to form p+ doping regions in the epitaxial layer 102, a patterned photoresist layer 302 is formed on the second plane P2 and the etching block layer 300, and the transition region 114, a portion of the etching block layer 300, and a portion of the epitaxial layer 102 in the floating ring region 110 are exposed.

Figure 3C:
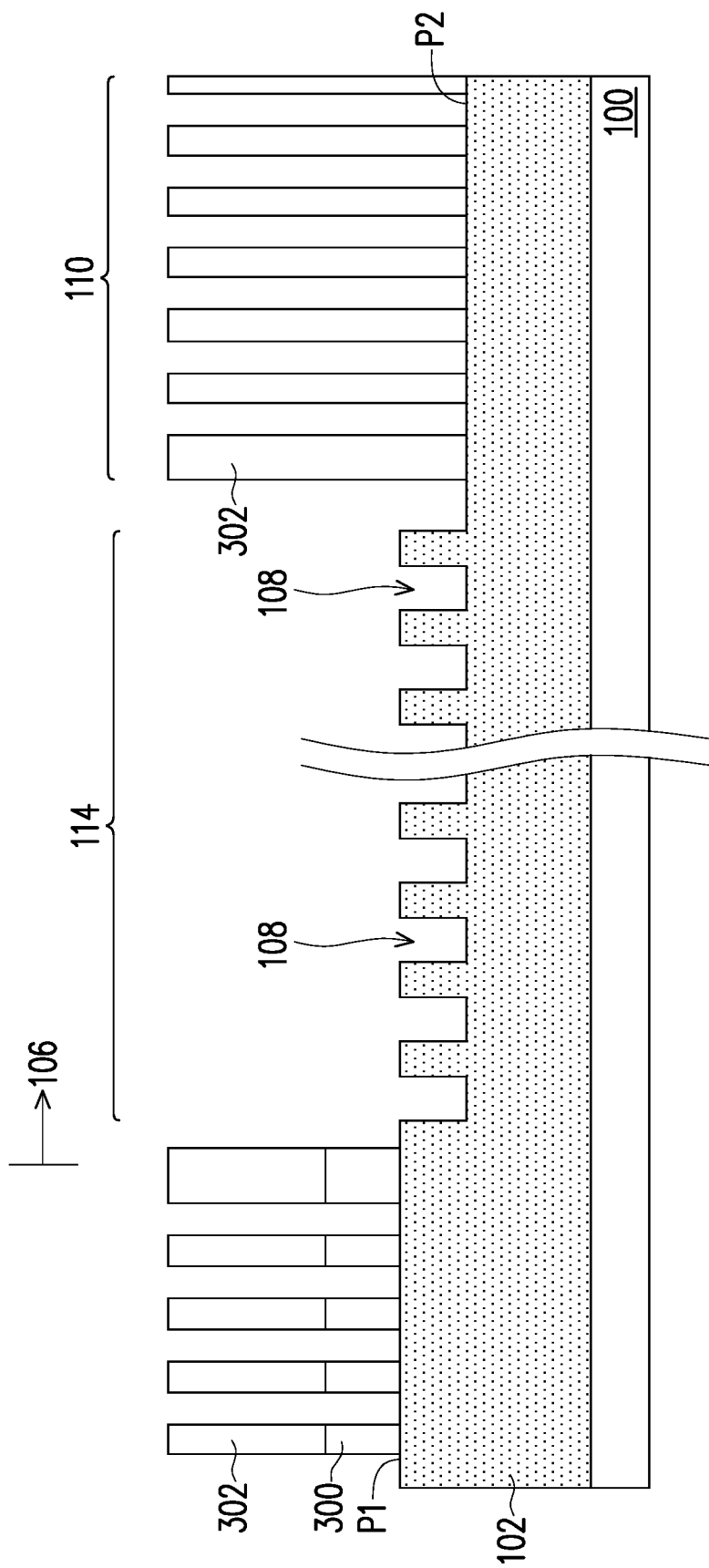

After that, referring to FIG. 3C, by using the patterned photoresist layer 302 as an etching mask, an etching is performed to remove the exposed etching block layer 300 on the first plane P1 and all the etching block layer 300 in the transition region 114.

Figure 3D:
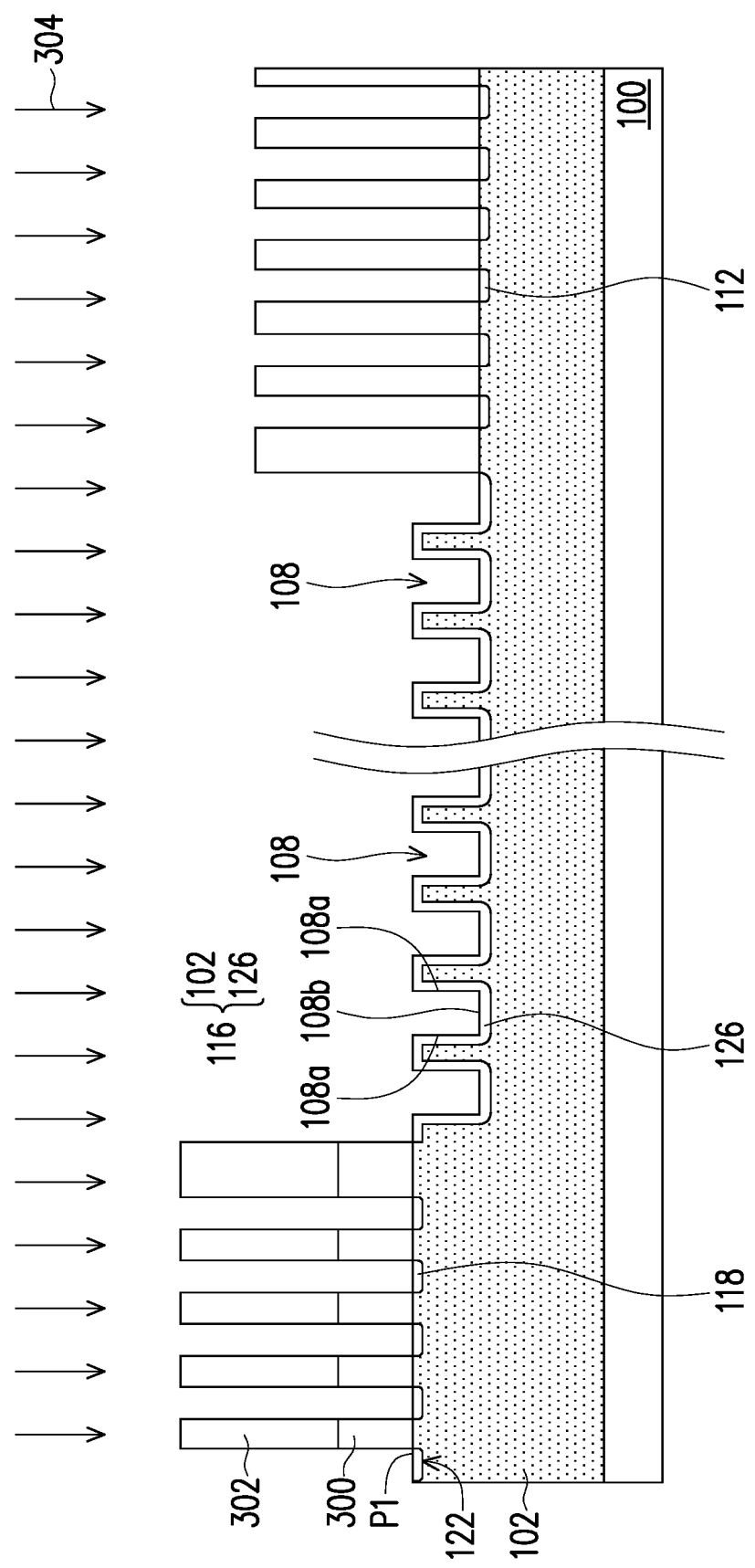

Thereafter, referring to FIG. 3D, at least one ion implantation 304 is performed to form first p+ doping regions 118, a second p+ doping region 126, and third p+ doping regions in the epitaxial layer 102 simultaneously. The ion implantation 304 may be one-step implantation or two-step implantation. In this step, a PIN diode 116, a plurality of floating rings 112, and a PN junction 122 between the epitaxial layer 102 and each of the first p+ doping region 118 are formed. The PIN diode 116 is formed in the sidewalls 108a and the bottoms 108b of the trenches 108, and thus the contact area of the PIN diode 116 is significantly larger than that formed on plat plane.

Figure 3E:
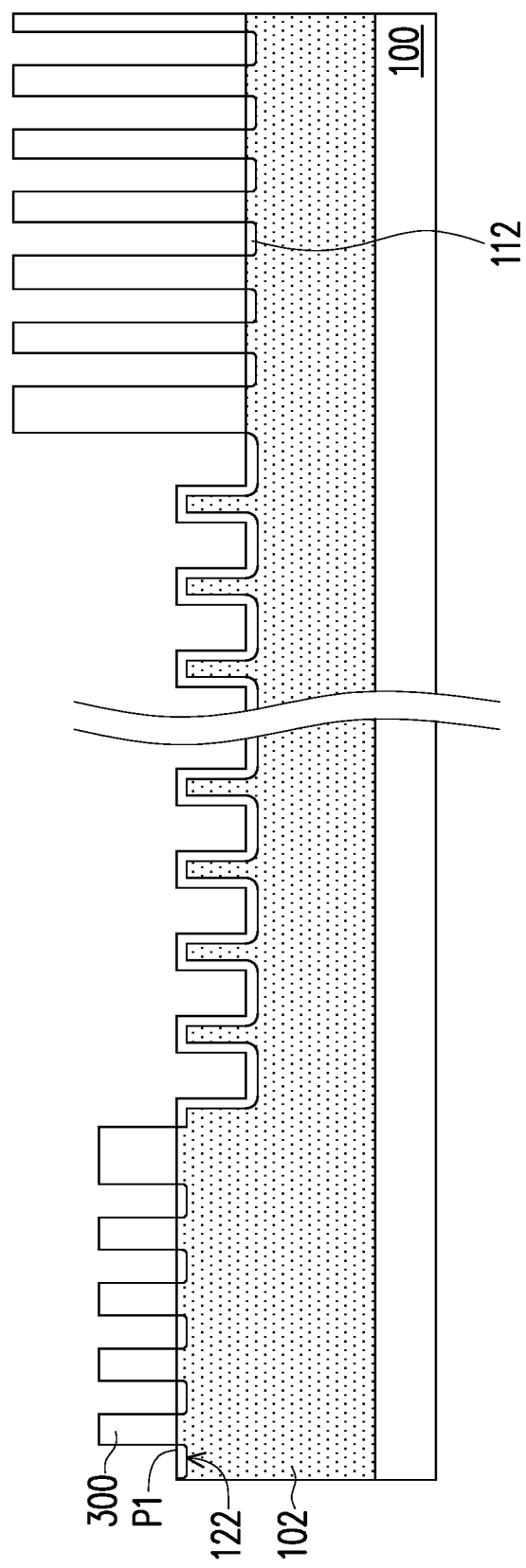

Then, referring to FIG. 3E, the patterned photoresist layer 302 is removed.

Figure 3F:
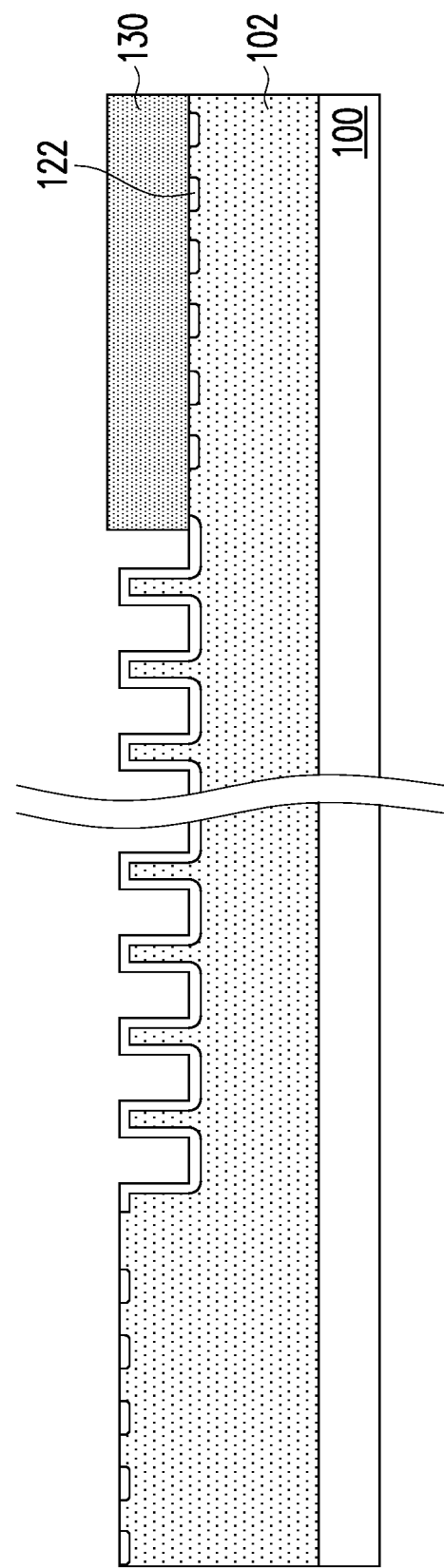

After that, referring to FIG. 3F, an insulating layer 130 is formed on the surface of the floating rings 112, and the etching block layer 300 is removed. If the insulating layer 130 and the etching block layer 300 are the same material, the step of forming the insulating layer 130 may be done before the removing of the etching block layer 300, and then the insulating layer 130 is covered by a protection film (not shown) followed by the removing of the etching block layer 300. Alternatively, the insulating layer 130 and the etching block layer 300 are different materials, the step of forming the insulating layer 130 may be done after the removing of the etching block layer 300.

Figure 3G:
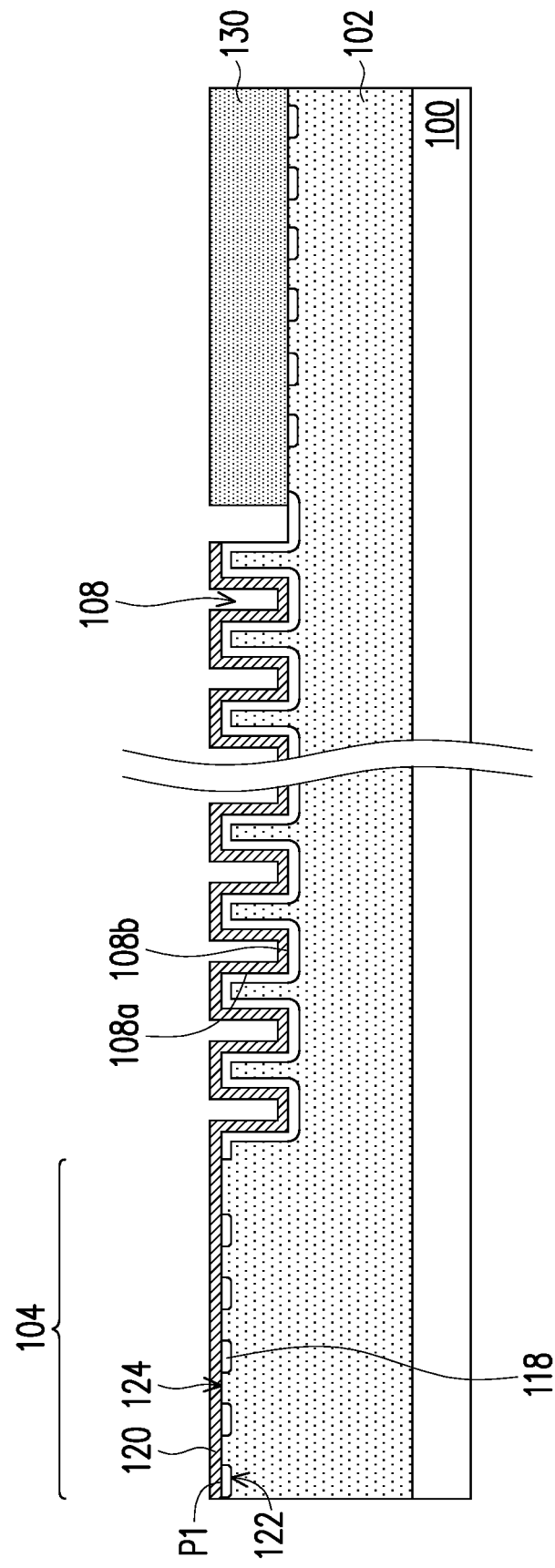

After that, referring to FIG. 3G, a Schottky metal layer 120 is formed on the epitaxial layer 102 to form a plurality of Schottky diodes 124 with the epitaxial layer 102 among the first p+ doping regions 118. The PN junction 122 and the Schottky diodes 124 constitute an array of merged PN junction Schottky (MPS) diode 104 in the first plane P1 of the epitaxial layer 102. The Schottky metal layer 120 may extend to cover the sidewalls 108a and the bottoms 108b of the trenches 108 and on the epitaxial layer 102 between the trenches 108. Therefore, the forward bias current can be greatly enhanced with the aid of trench side-wall metallurgy junction, thereby significantly enhancing the robustness of surge.

Figure 3H:
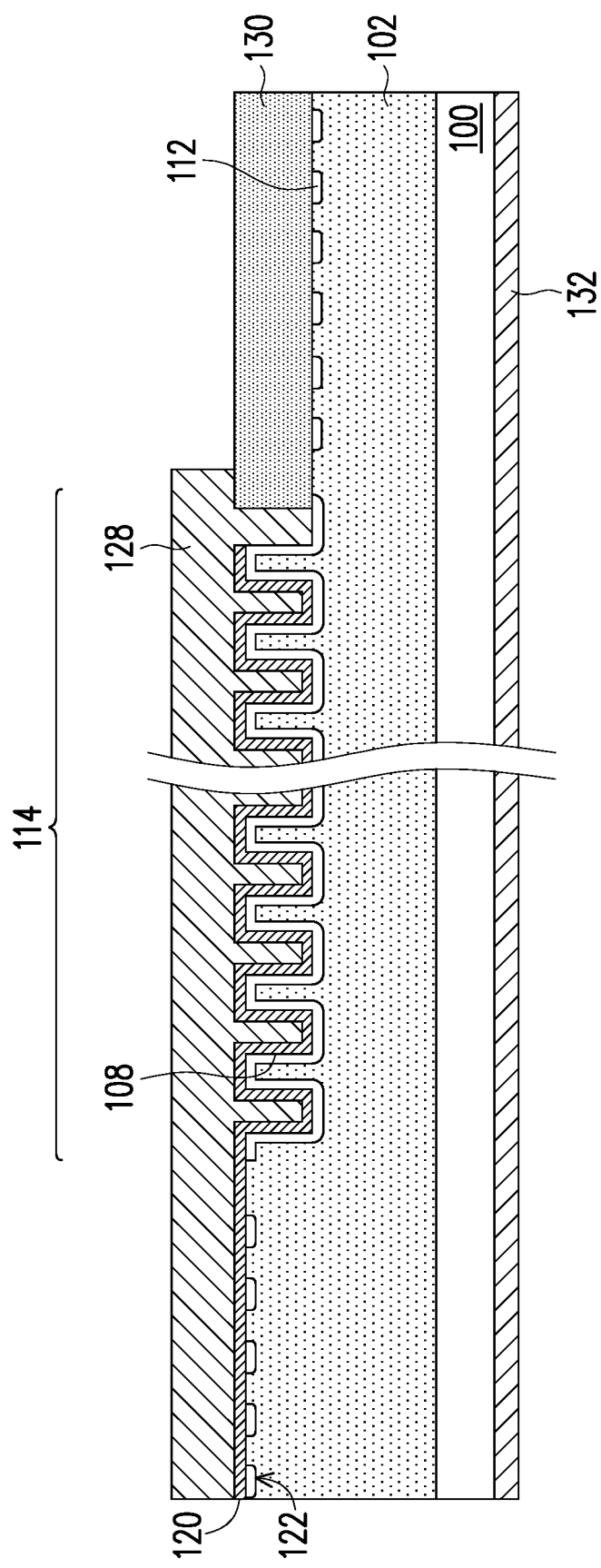

Thereafter, referring to FIG. 3H, a top metal layer 128 as an anode of the disclosure is formed on the Schottky metal layer 120 and extends to fill each of the trenches 108 in the transition region 114, and then a cathode metal layer 132 is formed on the back surface of the substrate 100.

In summary, since the wide-band gap semiconductor device of the disclosure has a PIN diode formed in the trenches, the contact area of the PIN diode can be significantly increased so as to greatly enhance the forward bias current with the aid of trench side-wall metallurgy junction. The surge current capability is therefore great enhanced. Moreover, the array of MPS diode and the floating rings within the edge termination area are disposed at different planes, and thus the MPS diode and the PIN diode in the transition region are electrical shielded by the floating rings due to early breakdown characteristic of closing to the substrate. The diode of the disclosure thereby, have better repetitive avalanche ruggedness performance. According to the method of the disclosure, the doping regions of the floating rings in the floating ring region, the PN junction of the MPS diodes, and the PIN diode in the transition region can be formed simultaneously, and thus the cost and time for manufacturing the device can be saved efficiently.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A wide-band gap semiconductor device, comprising:
    a substrate;
    an epitaxial layer disposed on the substrate, wherein the epitaxial layer includes a first plane, a second plane around the first plane, a plurality of trenches between the first plane and the second plane, and the second plane is closer to the substrate than the first plane;
    an array of merged PN junction Schottky (MPS) diode, formed in the first plane of the epitaxial layer; and
    an edge termination area surrounding the array of MPS diode, wherein the edge termination area comprises:
        a floating ring region having a plurality of floating rings formed in the second plane of the epitaxial layer; and
        a transition region between the floating ring region and the array of MPS diode, wherein the transition region comprises a PIN diode formed on the plurality of trenches and on the epitaxial layer between the trenches,
    wherein the array of MPS diode comprises:
        a plurality of first p+ doping regions in the epitaxial layer to form a PN junction between the epitaxial layer and each of the first p+ doping regions; and
        a Schottky metal layer disposed on the epitaxial layer to form a plurality of Schottky diodes with the epitaxial layer among the first p+ doping regions.

2. The wide-band gap semiconductor device of claim 1, wherein the Schottky diodes are enclosed by the first p+ doping regions.

3. The wide-band gap semiconductor device of claim 2, wherein a shape of the Schottky diodes is bar-shapes, dot-shape, hexagonal shape, circular shape, or a combination thereof.

4. The wide-band gap semiconductor device of claim 1, wherein the first p+ doping regions are enclosed by the Schottky diodes.

5. The wide-band gap semiconductor device of claim 1, wherein a depth of the first p+ doping regions is ranged between 0.1 μm and 0.35 μm.

6. The wide-band gap semiconductor device of claim 1, wherein the Schottky metal layer extends to cover sidewalls and bottoms of the trenches and on the epitaxial layer between the trenches.

7. The wide-band gap semiconductor device of claim 1, wherein the PIN diode comprises a second p+ doping region formed on sidewalls and bottoms of the trenches and on the epitaxial layer between the trenches.

8. The wide-band gap semiconductor device of claim 1, wherein a depth of each of the trenches is ranged between 0.3 μm and 2 μm.

9. The wide-band gap semiconductor device of claim 1, wherein a bottom of each of the trenches is the same plane as the second plane.

10. The wide-band gap semiconductor device of claim 1, wherein a number of the floating rings is between 5 and 50.

11. The wide-band gap semiconductor device of claim 1, wherein the plurality of floating rings is a plurality of third p+ doping regions.

* * * * *